United States Patent [19]

Beyer et al.

[11] Patent Number: 5,313,094
[45] Date of Patent: May 17, 1994

[54] THERMAL DISSIPATION OF INTEGRATED CIRCUITS USING DIAMOND PATHS

[75] Inventors: Klaus D. Beyer, Poughkeepsie; Chang-Ming Hsieh; Louis L. Hsu, both of Fishkill; David E. Kotecki; Tsoring-Dih Yuan, both of Hopewell Junction, all of N.Y.

[73] Assignee: International Business Machines Corportion, Armonk, N.Y.

[21] Appl. No.: 827,195

[22] Filed: Jan. 28, 1992

[51] Int. Cl.[5] .......................................... H01L 29/06
[52] U.S. Cl. ................................... 257/622; 257/625; 257/77
[58] Field of Search ................. 357/55, 81, 23.7; 165/185; 257/622, 625, 77

[56] References Cited

U.S. PATENT DOCUMENTS

| | | | |
|---|---|---|---|
| 2,817,048 | 12/1957 | Thuermel et al. | 317/234 |
| 3,142,595 | 7/1964 | Wentorf, Jr. | 148/171 |
| 3,628,106 | 12/1971 | Frank et al. | 357/55 |
| 3,678,995 | 7/1972 | Collard | 165/185 |
| 3,840,451 | 10/1974 | Golyanov | 204/192 |
| 3,872,496 | 3/1975 | Potter | 357/81 |
| 3,922,775 | 12/1975 | Potter | 29/589 |
| 3,925,078 | 12/1975 | Krøger et al. | 96/36.2 |
| 3,973,320 | 8/1976 | Greco | 29/578 |
| 3,974,514 | 8/1976 | Kressel et al. | 357/17 |
| 4,069,463 | 1/1978 | McGroddy et al. | 331/94.5 |
| 4,576,224 | 3/1986 | Eaton et al. | 165/80.2 |
| 4,649,992 | 3/1987 | Green et al. | 165/185 |
| 4,762,174 | 8/1988 | Artus | 165/185 |
| 4,764,845 | 8/1988 | Artus | 361/287 |
| 4,782,893 | 11/1988 | Thomas | 165/185 |
| 4,819,037 | 4/1989 | Sakakibara et al. | 357/4 |
| 4,856,015 | 8/1989 | Matsui et al. | 372/50 |
| 5,101,246 | 3/1992 | Onodera | 357/19 |

OTHER PUBLICATIONS

"Fabrication of Microchannels in Synthetic Polycrystalline Diamond Thin Films for Heat Sinking Applications", by R. Ramesham, T. Roppel, and C. Ellis, J. Electrochem. Soc. vol. 138, No. 6, Jun. 1991.

Primary Examiner—Jerome Jackson
Assistant Examiner—Stephen D. Meier
Attorney, Agent, or Firm—Michael J. Balconi-Lamica; Richard A. Romanchik

[57] ABSTRACT

A heat dissipation apparatus for dissipation of thermal energy from an isolated active silicon region to an underlying supportive substrate is disclosed. Such an apparatus comprises a diamond filled trench having walls extending through the isolated active silicon region, an underlying insulative layer, and into the supportive substrate, whereby said diamond filled trench provides a high thermal conductive path from said active silicon region to said substrate.

3 Claims, 4 Drawing Sheets

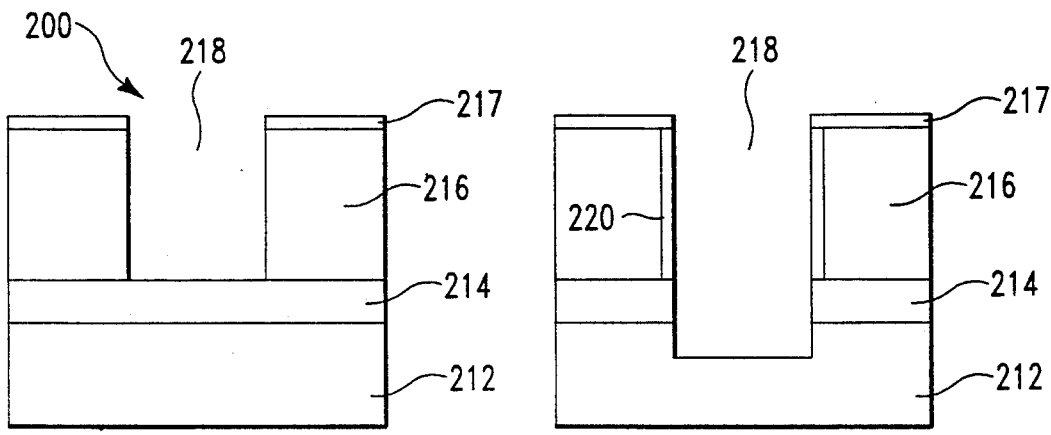
FIG. 3A
FIG. 3C
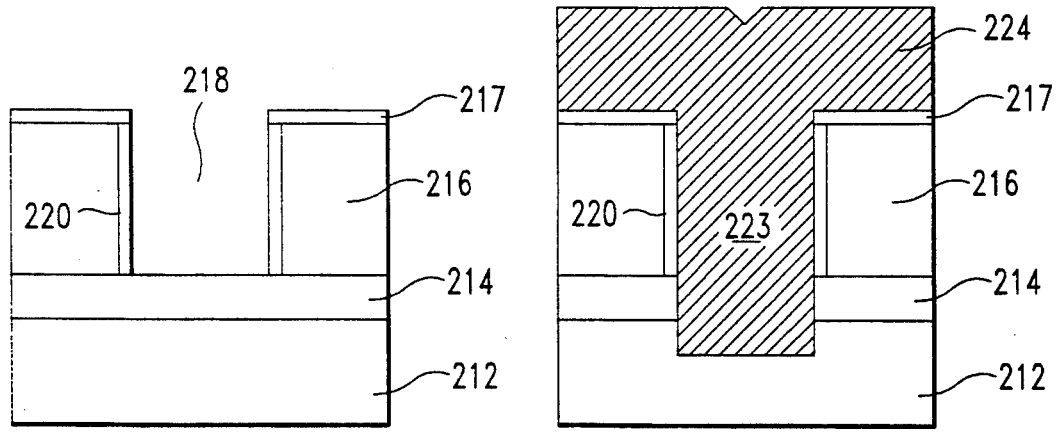
FIG. 3B
FIG. 3D

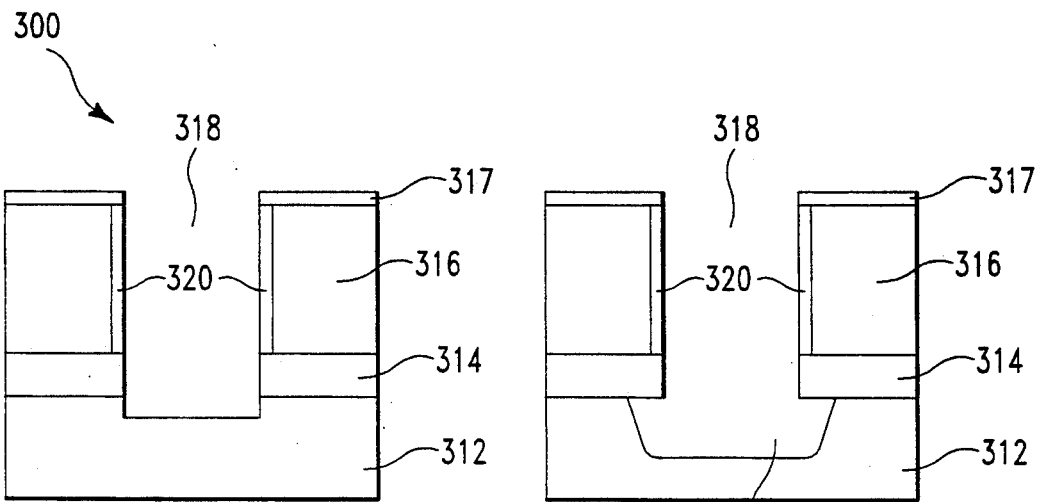
FIG. 4 A
FIG. 4 C
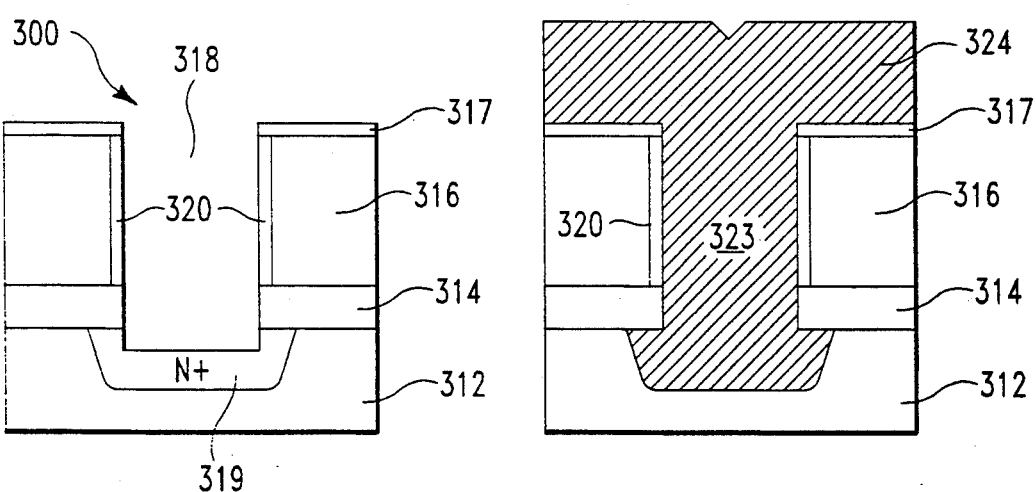
FIG. 4 B
FIG. 4 D

THERMAL DISSIPATION OF INTEGRATED CIRCUITS USING DIAMOND PATHS

TECHNICAL FIELD

This invention relates to thermal dissipation techniques for integrated circuits and more particularly to an improved thermal dissipation technique for high density integrated circuits utilizing diamond trenches or holes.

BACKGROUND ART

It is well known in the art to isolate regions of silicon from one another on a silicon substrate for the purpose of making active devices in the isolated regions. The most recent techniques for doing this involve isolating a layer of silicon vertically from an underlying silicon substrate with a dielectric layer, (commonly referred to as silicon on insulator or SOI). The advantages of having silicon devices on an insulator over bulk silicon substrates are that it provides higher packing density due to better isolation properties, simplified fabrication technology, radiation hardened capabilities, higher speeds due to fully depleted structures, and higher latch-up immunity. The above mentioned advantages to silicon on insulator structures are somewhat off set, however, by heat dissipation problems due to the fact that the isolating insulators have both a low electrical conductivity and low thermal conductivity. Poor power dissipation therefore imposes a considerable constraint for development of high speed/high power circuits on the isolated silicon regions.

A technique which resolves these thermal dissipation problems by providing a high thermal conductive path from the isolated silicon regions to the underlying silicon substrate is therefore highly desirable.

DISCLOSURE OF THE INVENTION

An object of the present invention is to provide a technique to dissipate thermal energy from isolated silicon regions.

Another object of the present invention is to provide a technique to help to dissipate thermal energy from isolated silicon regions that can be utilized in VLSI technology.

According to the present invention, dissipation of thermal energy from isolated active silicon regions is provided by etching a trench or hole through the isolated active silicon regions and the underlying dielectric layer to the supportive silicon substrate; oxidizing the walls of the trench or hole; and, filling the trench or hole with CVD diamond material.

The present invention provides for electrical isolation of active regions of silicon while providing excellent thermal dissipation characteristics. The present invention can be utilized for VLSI technology because the thermal dissipation structures use the existing electrical isolation trenches utilized in the prior art. In addition, the present invention is easy to incorporate and minimizes less thermal expansion problems which plague prior art electrical isolation techniques.

These and other objects, features and advantages of the present invention will be more apparent in light of the detailed description of exemplary embodiments thereof as illustrated by the drawings.

BRIEF DESCRIPTION OF THE DRAWINGS

FIGS. 3A–3D are cross sectional views of the structure resultant from the steps for producing a conductive thermal path in accordance with a third embodiment of the present invention.

FIGS. 4A–4D are cross sectional views of the structure resultant from the steps for producing a conductive thermal path in accordance with a fourth embodiment of the present invention.

BEST MODE FOR CARRYING OUT THE INVENTION

Figure 1A:
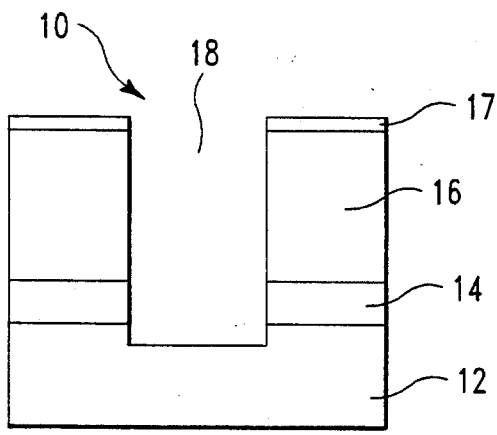
FIG. 1A–1F are cross sectional views of the structure resultant from the steps for producing a conductive thermal path in accordance with a first embodiment of the present invention.

Referring now to FIG. 1A, an isolated silicon structure 10 is comprised of an underlying silicon substrate 12, an intermediate isolation layer 14 comprised of an electrically insulative material, such as silicon dioxide or nitride, a top active isolated region 16 of silicon to which devices are to be built upon and a dielectric layer 17, such as nitride/oxide. A trench or hole 18 is patterned through the dielectric layer 17, silicon region 16, and isolation layer 14, and further into the silicon substrate 12 utilizing patterning techniques well known in the art, such as RIE.

Figure 1B:
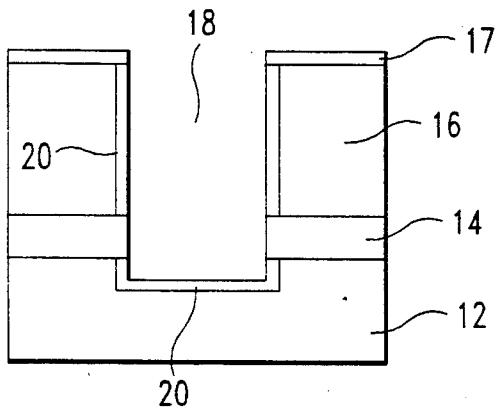

Referring now to FIG. 1B, a thin thermal oxide layer 20 is formed on the walls and bottom of the trench 18 utilizing thermal oxidation techniques well known in the art. It is preferable that the thickness of the oxide layer be on the order of 300 angstroms. The purpose of having this layer 20 is to keep CVD diamond (described hereinafter) from directly contacting the silicon surface to avoid excessive surface charges. Thin oxide layer 20 is a passivation layer.

Figure 1C:
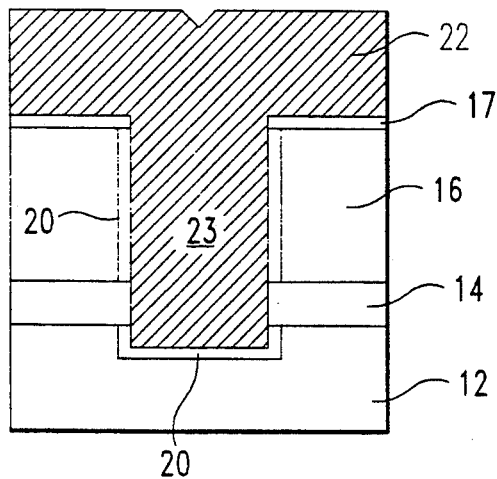

Referring now to FIG. 1C, a CVD diamond or diamond like layer 22 is deposited over the structure utilizing techniques well known in the art, thereby forming a diamond filled trench or hole 23. An example of CVD diamond deposition is found in U.S. Pat. No. 3,840,451 (Golyanov, et al.) which is hereby incorporated herein by reference. Diamond can be deposited over a wide range of deposition temperatures (200° C. to 1,000° C.) using a variety of hydrocarbon precursors (i.e. $CH_4$, $C_2H_6$) using either a RF or microwave generated plasma. Deposition conditions for downstream microwave generated diamond films are: a frequency of 2.45 GHz, power of 200–2,000 watts, a pressure of 0.1–100 Torr, a gas flow of 10–500 sccm, and a substrate temperature of 200°–1,000° C. The substrate is also biased with greater than a −100 Vdc or an RF bias of greater than −5 V. Diamond films deposited are polycrystalline or amorphous in nature with average grain size between 50–300 angstroms. The diamond layer 22 should completely fill the trench 18. The diamond film 22 is well suited for the present application because it has a low dielectric constant (3–6 depending on process conditions), high electrical resistivity (1E10 to 1E16 ohms/cm) and a matched thermal expansion coefficient with silicon (e.g. silicon: 32E-7/C, diamond: 18E-7/C, oxide: 6E-7/C). In addition, the film deposited 22 has a low compressive stress and after being annealed at 500°

C., the stress is reduced to a non-measurable level. The resultant diamond filled trench or hole 23 provides a heat conductive path to dissipate thermal energy from the active silicon region 16 to the substrate 12.

Figure 1D:
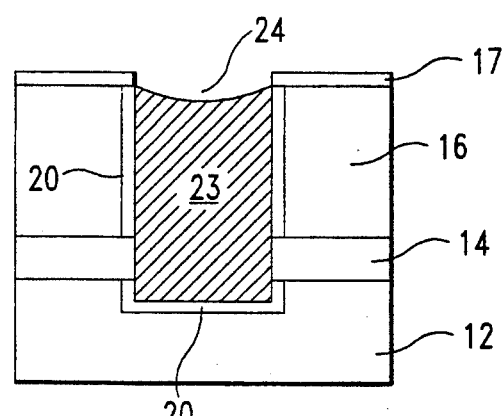

Referring now to FIG. 1D, the diamond layer 22 is planarized using techniques well known in the art, such as O₂/Ar RIE. This etching technique removes the diamond layer 22 from the top of the dielectric layer 17 and recesses the diamond filled trench or hole 23 below the top of the dielectric layer 17 to thereby create a recess area 24.

Figure 1E:
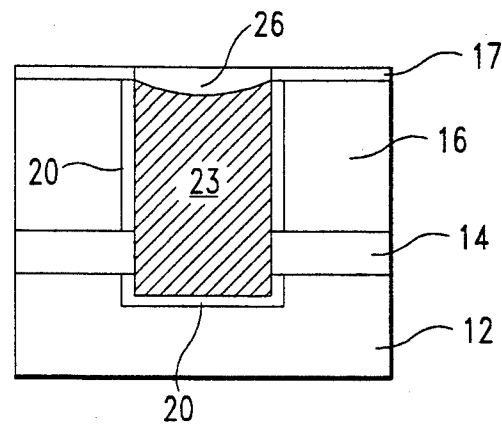

Referring now to FIG. 1E, the recess area 24 is then filled with intrinsic polysilicon, utilizing deposition techniques well known in the art, such as CVD. The polysilicon layer 26 is then polished back to the top of the dielectric layer 17.

Figure 1F:
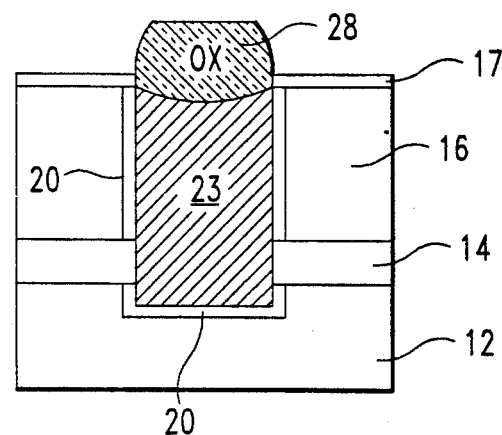

Referring now to FIG. 1F, the polysilicon cap 26 is then oxidized to form an oxide cap 28 on top of the diamond filled trench 18. Alternatively, other insulators, such as nitrides, may be utilized to cap the trench 18. It is to be noted that the insulative cap 28 is necessary to protect the diamond inside the trench 18 from being unintentionally removed during subsequent oxygen plasma processing, such as resist ashing or the like.

Figure 2A:
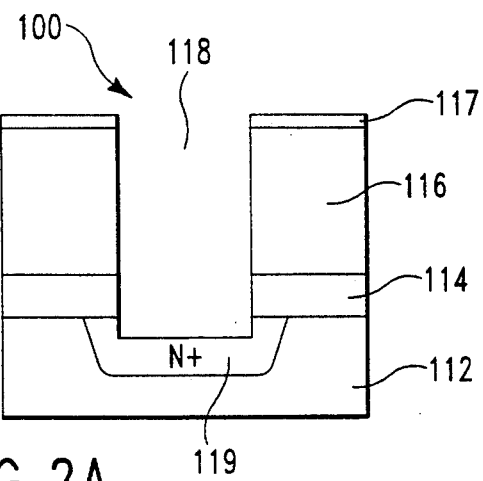
FIGS. 2A–2F are cross sectional views of the structure resultant from the steps for producing a conductive thermal path in accordance with a second embodiment of the present invention.

Referring now to FIG. 2A, a second embodiment in accordance with the present invention includes a structure 100 comprised of a silicon substrate 112 having an insulative layer 114 which separates the silicon substrate 112 from an active silicon region 116 to which devices are to be built thereon. A dielectric layer 117 is needed to passivate the silicon surface. A trench or hole 118 is patterned through the dielectric layer 117, silicon layer 116 and the insulation layer 114, and further into the substrate 112. Layers 112–117 and trench 118 are similar to the structure described and illustrated hereinbefore in FIG. 1A. After the trench or hole 118 is provided, a vertical implant is performed on the bottom of the trench 118 with a N dopant, such as Arsenic, and driven into the substrate 112. The subsequent doped region is illustrated by area 119. Although different dopant techniques may be utilized, it is important that the characteristic etch response of the resultant doped area 119 be different from that of the substrate 112.

Figure 2D:
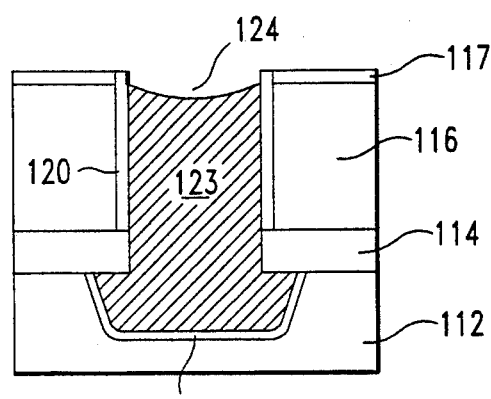
Figure 2B:
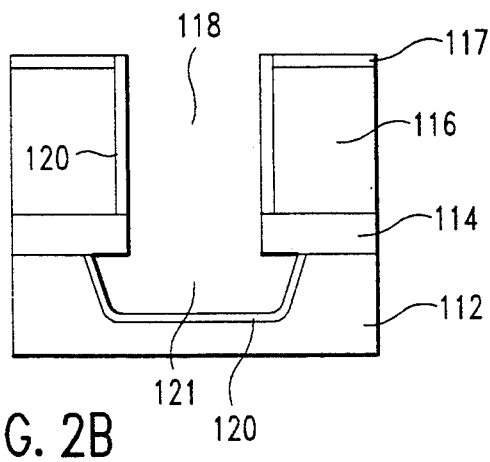

Referring now to FIG. 2B, next the doped area 119 is etched away using selective lateral etching techniques well known in the art, such as wet etch or selective plasma etch to thereby form a void or cavity 121 below trench 118. A thin insulative layer 120 of an insulator such as a thermal oxide is formed onto the walls and bottom of trench 118 and void or cavity 121. The preferred thickness of the layer 120 is on the order of 300 angstroms.

Figure 2E:
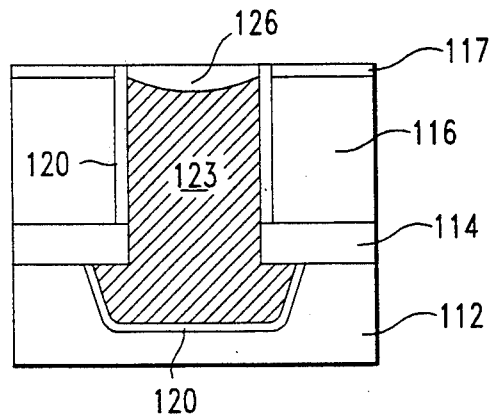
Figure 2C:
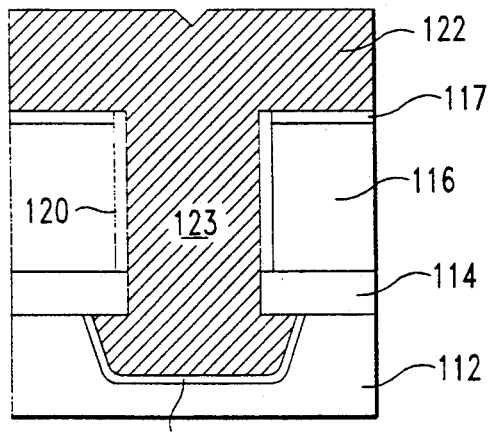

Referring now to FIG. 2C, a layer of CVD diamond or Diamond-like material 122 is then deposited over the structure 100 in a manner similar to that described and illustrated hereinbefore in FIG. 1C, to thereby form a diamond filled trench or hole 123. The increased amount of diamond which consequently fills cavity 121 provides greater surface area than that illustrated in FIG. 1C and therefore provides improved heat dissipation for devices built on layer 116.

Figure 2F:
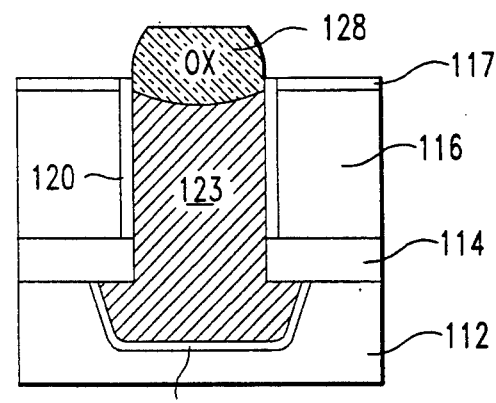

Referring now to FIG. 2D–2F, the diamond layer 122 is then planarized to create a recess 124 which is filled with a polysilicon layer 126, planarized and oxidized to thereby form an oxide cap 128 in a manner similar to that described and illustrated hereinbefore in FIGS. 1D–1F.

Referring now to FIG. 3A, a third embodiment of the present invention includes a structure 200 comprising a silicon substrate 212, an insulation layer 214, a silicon layer 216 and a dielectric layer 217. A trench or hole 218 is patterned through only the dielectric layer 217 and silicon layer 216 by using a CF₄ and Cl₂ plasma subsequently.

Referring now to FIG. 3B, a thin layer 220 of oxide is formed on the walls of trench 218.

Referring now to FIG. 3C, a directional oxide RIE is then used to continue patterning the trench 218 through layer 214 and into substrate 212.

Referring now to FIG. 3D, a CVD diamond layer 224 is deposited over the structure 200, thereby forming a diamond filled trench or hole 223. The remaining steps for the third embodiment thereafter continues identically to the steps of the first embodiment as described and illustrated in FIGS. 1D–1F.

The difference between FIG. 3C and FIG. 1B is that the bottom of the trench is not covered by the oxide layer. This approach will further improve the thermal dissipation to remove heat from the devices on 216 to substrate 212.

Referring now to FIG. 4A, a fourth embodiment in accordance with the present invention includes a structure 300 similar to structure 200 described and illustrated hereinbefore in FIG. 3C, having a silicon substrate 312, an insulation layer 314, a silicon layer 316 and a dielectric layer 317. A trench or hole 318 is patterned through layers 317, 316, 314 into substrate 312. Subsequent to the patterning of trench 318 through layers 317 and 316 and prior to the patterning of trench 318 through layer 314 and into substrate 312, a thin oxide layer 320 is formed on the walls of trench 318.

Referring now to FIG. 4B, a N+implant region 319 having a characteristic etch response different from that of the substrate 312 is provided at the bottom of the trench 318.

Referring now to FIG. 4C, a selective etching technique is utilized to remove N+implanted region 319 to thereby form a cavity 321.

Referring now to FIG. 4D, a CVD diamond layer 324 is deposited over structure 300, thereby forming a diamond filled trench or hole 323 and the remaining steps of the fourth embodiment proceed exactly as in accordance with the second embodiment described and illustrated hereinbefore in FIGS. 2C–2F. It is to be noted that the increased amount of diamond which consequently fills cavity 321 provides greater surface area than that illustrated in FIG. 3D and therefore provides improved heat dissipation for devices built on layer 316.

Although the invention has been shown and described with exemplary embodiments thereof, it should be understood by those skilled in the art that the foregoing and various other changes, omissions and additions may be made therein and thereto without departing from the spirit and the scope of the invention.

What is claimed is:

1. A silicon-on-insulator heat dissipation apparatus comprising:
   a silicon substrate;
   an insulation layer disposed on said substrate;
   an active semiconductor region disposed on said insulation layer;
   a chemical vapor deposited (CVD) diamond filled trench having walls extending from top to bottom through said active semiconductor region, said insulation layer and into said substrate;

a CVD diamond filled cavity positioned below and in contact with the bottom of said CVD diamond filled trench, said CVD diamond filled cavity further having walls extending laterally beyond the diamond filled trench walls into said substrate; and, a thin passivation layer on the order of 300 Å formed on the walls of said trench and said cavity, whereby said diamond filled trench and cavity provide a high thermal conductive path from said active semiconductor region to said substrate.

2. A silicon-on-insulator heat dissipation apparatus comprising:

a silicon substrate;

an insulation layer of insulation material disposed on said substrate;

an active semiconductor region disposed on said insulation layer;

a chemical vapor deposited (CVD) diamond filled trench having walls extending from top to bottom through said active semiconductor region, said insulation layer and into said substrate;

a CVD diamond filled cavity positioned below and in contact with the bottom of said CVD diamond filled trench, said CVD diamond filled cavity further having walls extending laterally beyond the diamond filled trench walls into said substrate; and, a thin passivation layer on the order of 300 Å formed on the walls of said diamond filled trench only at said active semiconductor region, whereby aid diamond filled trench and cavity provide a high thermal conductive path from said active semiconductor region to said substrate.

3. A silicon-on-insulator heat dissipation apparatus according to claims 1 or 2, further comprising an insulative cap disposed on said CVD diamond filled trench.

* * * * *